United States Patent
Kim et al.

(10) Patent No.: US 10,535,833 B2
(45) Date of Patent: Jan. 14, 2020

(54) LIGHTING APPARATUS USING ORGANIC LIGHT-EMITTING DIODE AND MANUFACTURING METHOD THEREOF

(71) Applicant: LG Display Co., Ltd., Seoul (KR)

(72) Inventors: Jong-Min Kim, Paju-si (KR); Tae-Joon Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/032,200

(22) Filed: Jul. 11, 2018

(65) Prior Publication Data

US 2019/0019981 A1    Jan. 17, 2019

(30) Foreign Application Priority Data

Jul. 11, 2017    (KR) .................. 10-2017-0088049

(51) Int. Cl.
*H01L 51/52*    (2006.01)
*H01L 51/00*    (2006.01)
*H01L 51/56*    (2006.01)

(52) U.S. Cl.
CPC ...... *H01L 51/5212* (2013.01); *H01L 51/0021* (2013.01); *H01L 51/5237* (2013.01); *H01L 51/5253* (2013.01); *H01L 51/56* (2013.01); *H01L 2251/5392* (2013.01)

(58) Field of Classification Search
None
See application file for complete search history.

(56) References Cited

U.S. PATENT DOCUMENTS

2019/0019975 A1*  1/2019  Song ................... H01L 51/5203
2019/0019982 A1*  1/2019  Kim .................... H01L 51/5212

FOREIGN PATENT DOCUMENTS

| KR | 10-2003-0034325 A | 5/2003 |
| KR | 10-2003-0076917 A | 9/2003 |
| KR | 10-2014-0138614 A | 12/2014 |

* cited by examiner

*Primary Examiner* — Grant S Withers
(74) *Attorney, Agent, or Firm* — Polsinelli PC

(57) ABSTRACT

According to a lighting apparatus using an organic light-emitting diode and a manufacturing method thereof of the present disclosure, a current imbalance due to a short circuit is controlled using a transparent high-resistance conductive film as a positive electrode instead of indium tin oxide (ITO), and a decrease in luminance is prevented by decreasing resistance of a positive electrode of an emission region through a post treatment. According to the present disclosure, it is possible to solve the problem of lighting malfunction of an entire panel, caused by a short circuit due to a foreign substance, even without reducing an aperture ratio, and concurrently, it is possible to secure normal luminance as resistance of an emission region is decreased.

12 Claims, 16 Drawing Sheets resistance notation: 10^x (Ω/square)

| temperature condition | coating condition | | heat treatment time(min) | | | | | |
|---|---|---|---|---|---|---|---|---|
| | ejection rate(μl/s) | thickness(nm) | 0 | 20 | 40 | 60 | 80 | 100 |
| 150°C | 100 | 124 | 8.6 | 8 | 7.9 | 7.7 | 7.7 | 7.7 |
| | 200 | 263 | 7.8 | 7.8 | 7.8 | 7.7 | 7.6 | 7.6 |
| | 300 | 396 | 4.6 | 6.6 | 6.5 | 6.5 | 6.4 | 6.3 |
| | 400 | 520 | 7.7 | 6.5 | 6.4 | 6.4 | 6.3 | 6.2 |
| | 500 | 718 | crack generation | | | | | |
| 250°C | 100 | 124 | 8.6 | 6.2 | 6.1 | 6.1 | 6.1 | 5.9 |
| | 200 | 263 | 7.8 | 6.2 | 6.2 | 5.9 | 5.8 | 5.8 |
| | 300 | 396 | 7.6 | 5.5 | 5.4 | 5.3 | 5.3 | 5.3 |
| | 400 | 520 | 7.7 | 5.5 | 5.5 | 5.3 | 5.3 | crack |
| | 500 | 718 | crack generation | | | | | |

LIGHTING APPARATUS USING ORGANIC LIGHT-EMITTING DIODE AND MANUFACTURING METHOD THEREOF

CROSS-REFERENCE TO RELATED APPLICATION

This application claims the benefit under 35 U.S.C. § 119(a) of Korean Patent Application No. 10-2017-0088049, filed on Jul. 11, 2017, in the Korean Intellectual Property Office, which is incorporated herein by reference in its entirety.

BACKGROUND

Field of the Disclosure

The present disclosure relates to a lighting apparatus, and more particularly, to a lighting apparatus using an organic light-emitting diode and a manufacturing method thereof.

Description of the Background

Currently, a fluorescent lamp or an incandescent lamp is mainly used as a lighting apparatus. Among these, the incandescent lamp has a high color rendering index (CRI) but has low energy efficiency. The fluorescent lamp has high efficiency, but has a low CRI and contains mercury causing an environmental problem.

A CRI is an index for indicating ability to reproduce colors and indicating a degree of similarity between a sense of a color when an object is illuminated by a specific light source and a sense of a color when the object is illuminated by a reference light source. For example, a CRI of the sunlight is 100.

In order to solve such a problem of an existing lighting apparatus, recently, light-emitting diodes (LEDs) have been proposed as lighting apparatuses. LEDs are made of an inorganic light-emitting material. Luminous efficiency of LEDs is the highest in a blue wavelength range and is gradually lowered toward a red wavelength range and a green wavelength range, in which a green color has the highest spectral luminous efficacy. Thus, when white light is emitted by combining a red LED, a green LED, and a blue LED, luminous efficiency is lowered.

As other alternatives, lighting apparatuses using an organic light-emitting diode (OLED) have been developed. Lighting apparatuses using a general OLED are manufactured as follows: an anode made of indium tin oxide (ITO) is formed on a glass substrate, an organic light-emitting layer and a cathode are formed, and a passivation layer and a lamination film are formed thereon to be manufactured.

In the case of lighting apparatuses using the OLED, when a short circuit can be caused due to a foreign substance, luminance is decreased due to a current drop in the entire panel as well as a corresponding pixel in which the short circuit is generated.

SUMMARY

The present disclosure is contrived to solve the aforementioned problem and directed to providing a lighting apparatus using an organic light-emitting diode (OLED) capable of preventing luminance of an entire panel from being decreased when a short circuit is generated due to a foreign substance, and a manufacturing method thereof.

The present disclosure is also directed to providing a lighting apparatus using an OLED capable of preventing a decrease in the luminance even without reducing an aperture ratio, and a manufacturing method thereof.

Features of the present disclosure will be described in the configuration of the disclosure and claims which follow herein below.

According to an aspect of the present disclosure, a lighting apparatus using an organic light-emitting diode includes an auxiliary electrode provided on a substrate, a first electrode of a non-emission region composed of a transparent conductive film and provided to cover the auxiliary electrode, and a first electrode of an emission region provided on each of side surfaces of the first electrode of the non-emission region, a first passivation layer provided on an upper portion of the first electrode of the non-emission region, an organic light-emitting layer and a second electrode, provided in a lighting part of the substrate on which the first passivation layer is provided, and a metal film provided in the lighting part of the substrate.

The first electrode of the non-emission region may have a resistance value higher than that of indium tin oxide (ITO), and the first electrode of the emission region may have a resistance value lower than that of the first electrode of the non-emission region.

The first electrode of the non-emission region may have a sheet resistance of $10^8$ Ω/square to $10^9$ Ω/square.

The first electrode of the emission region may have a sheet resistance of $10^3$ Ω/square to $10^4$ Ω/square.

The transparent conductive film may include 1% to 10% of a conductive material, 80% to 90% of a solvent, 10% to 20% of a binder, and about 1% of an additive.

The conductive material may include poly(3,4-ethylenedioxythiophene) polystyrene sulfonate (PEDOT:PSS) as a conductive polymer material.

The binder may include a silicon-based binder such as tetraethyl orthosilicate (TEOS), silsesquioxane (SSQ), or polysiloxane, or an acrylic-based binder.

The conductive material may include graphene, a single-walled carbon nanotube (SWCNT), or a multi-walled carbon nanotube (MWCNT).

The conductive material may include a copper nanowire (CuNW), a silver nanowire (AgNW), or a gold nanowire (AuNW).

The first electrode of the non-emission layer may have a side surface matching a side surface of the first passivation layer on the upper portion thereof.

According to another aspect of the present disclosure, a manufacturing method of a lighting apparatus using an organic light-emitting diode includes forming an auxiliary electrode on a substrate, forming a first electrode using a transparent conductive film having a resistance value higher than that of indium tin oxide (ITO) on the substrate on which the auxiliary electrode is formed, forming a first passivation layer on the substrate on which the first electrode is formed, so as to cover the auxiliary electrode, and decreasing a resistance value of a first electrode of an emission region, not covered with the first passivation layer, through a heat treatment.

According to still another aspect of the present disclosure, a manufacturing method of a lighting apparatus using an organic light-emitting diode includes forming an auxiliary electrode on a substrate, forming a conductive pattern using a transparent conductive film having a resistance value higher than that of indium tin oxide (ITO) on the substrate on which the auxiliary electrode is formed, forming a first passivation layer on the substrate on which the conductive pattern is formed, so as to cover the auxiliary electrode, forming a first electrode of a non-emission region on a lower portion of the first passivation layer by selectively removing the conductive pattern using the first passivation layer as a mask, the first electrode of the non-emission region being composed of the transparent conductive film, and forming a first electrode of an emission region, not covered with the first passivation layer, the first electrode of the emission region having a resistance value lower than that of the first electrode of the non-emission region.

The manufacturing methods according to another aspect and still another aspect of the present disclosure may further include forming an organic light-emitting layer and a second electrode in a lighting part of the substrate on which the first passivation layer is formed, and attaching a metal film to the lighting part of the substrate.

The transparent conductive film may have a sheet resistance of $10^8$ Ω/square to $10^9$ Ω/square.

The first electrode of the emission region may have a sheet resistance of $10^3$ Ω/square to $10^4$ Ω/square.

The resistance value of the first electrode of the emission region may be decreased by performing a heat treatment such as plasma or laser irradiation on the first electrode of the emission region, not covered with the first passivation layer.

The first electrode of the emission region may be composed of the transparent conductive film and may be formed to have a sheet resistance of $10^3$ Ω/square to $10^4$ Ω/square by increasing a content (wt %) of a conductive polymer material, a carbon-based material, or a nanowire-based material.

BRIEF DESCRIPTION OF THE DRAWINGS

The accompanying drawings, which are included to provide a further understanding of the disclosure, are incorporated in and constitute a part of this application, illustrate implementations of the disclosure and together with the description serve to explain the principles of aspects of the disclosure.

DETAILED DESCRIPTION

Figure 1:
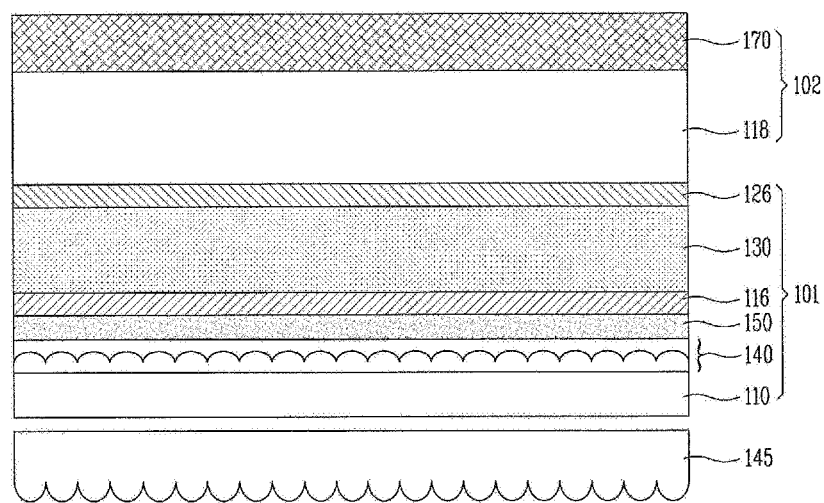
FIG. 1 is a cross-sectional view exemplarily showing a lighting apparatus using an organic light-emitting diode (OLED) according to an aspect of the present disclosure.

Hereinafter, exemplary aspects of a lighting apparatus using an organic light-emitting diode (OLED) according to the present disclosure and a manufacturing method thereof will be described in detail with reference to the accompanying drawings for those skilled in the art to easily implement the present disclosure Advantages and features of the present disclosure and methods of accomplishing those may be understood more readily by reference to the following detailed description of exemplary aspects and the accompanying drawings. The present disclosure may, however, be embodied in many different forms and should not be construed as being limited to the exemplary aspects set forth herein. Rather, these exemplary aspects are provided so that this disclosure will be thorough and complete and will fully convey the concept of the present disclosure to those skilled in the art, and the disclosure will only be defined by the appended claims. Like reference numerals refer to like elements throughout the specification. In the drawings, the sizes and relative sizes of layers and regions may be exaggerated for clarity.

It will be understood that when an element or layer is referred to as being "on" another element or layer, the element or layer can be located directly on the other element or layer or intervening elements or layer may also be present. In contrast, when an element or layer is referred to as being "directly on" another element or layer, there are no intervening elements or layers present.

Spatially relative terms, such as "beneath," "below," "lower," "above," "upper" and the like, may be used herein to easily describe a correlation between one element or components and another element or other components as illustrated in the drawings. It will be understood that the spatially relative terms are intended to encompass different orientations of the element in use or operation in addition to the orientation depicted in the drawings. For example, if the element in the drawings is turned over, elements described as "below" or "beneath" other elements would then be oriented "above" the other elements. Thus, the exemplary term "below" can encompass both an orientation of above and below.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises", "comprising", "includes" and/or "including," if used herein, specify the presence of stated steps, operations, elements and/or components, but do not preclude the presence or addition of one or more other steps, operations, elements, components and/or groups thereof.

FIG. 1 is a cross-sectional view exemplarily showing a lighting apparatus 100 using an OLED according to an aspect of the present disclosure.

Figure 2:
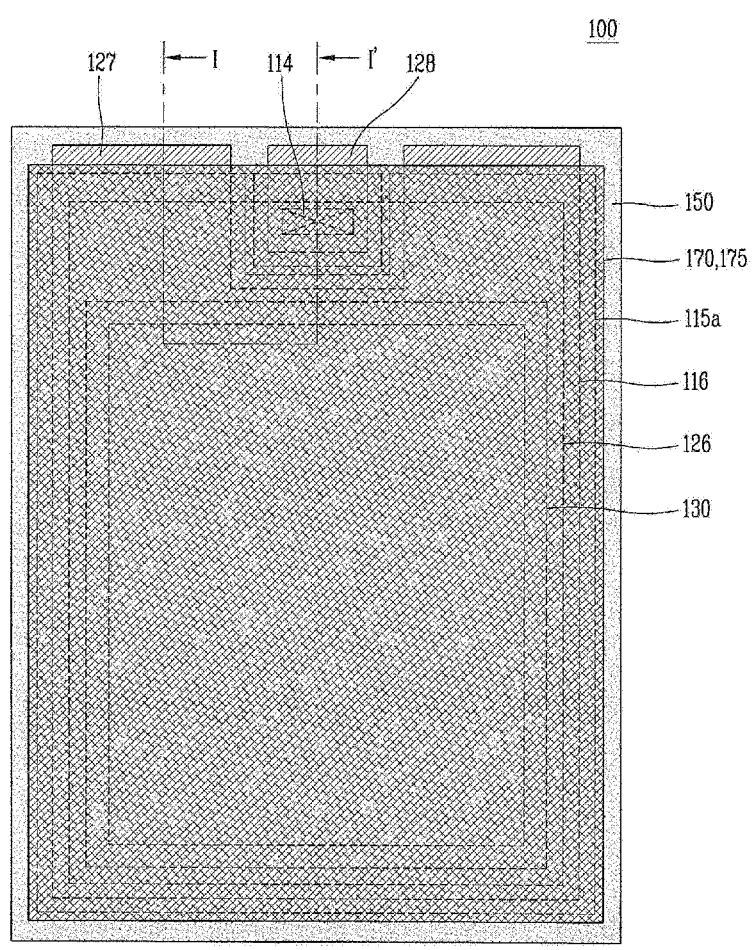
FIG. 2 is a schematic plan view showing a lighting apparatus using an OLED according to an aspect of the present disclosure.

FIG. 2 is a schematic plan view showing the lighting apparatus 100 using the OLED according to the aspect of the present disclosure.

Figure 3:
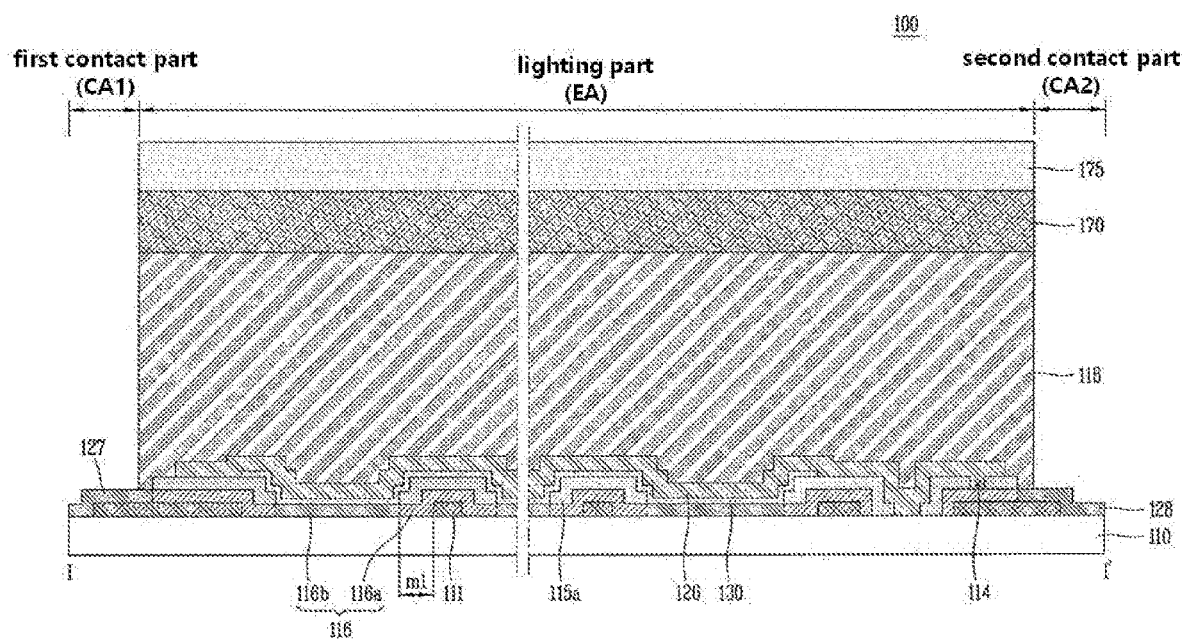
FIG. 3 is a schematic cross-sectional view taken along line I-I' of the lighting apparatus using the OLED according to the aspect of the present disclosure shown in FIG. 2.

FIG. 3 is a schematic cross-sectional view taken along line I-I' of the lighting apparatus 100 using the OLED according to the aspect of the present disclosure as shown in FIG. 2.

Figure 4:
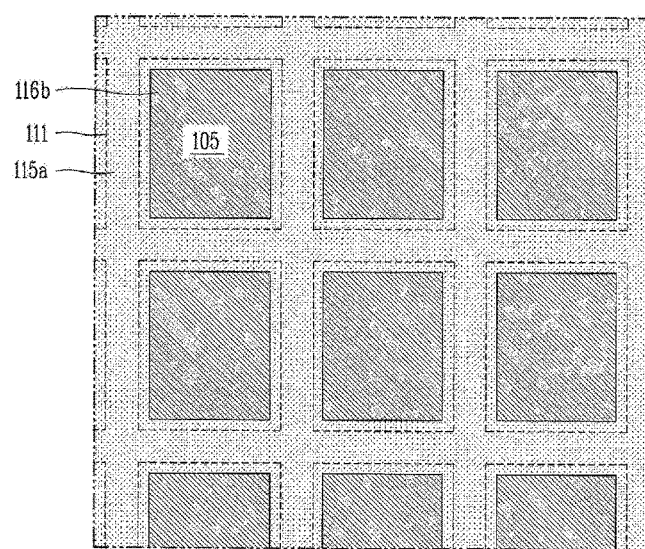
FIG. 4 is an enlarged view showing a portion of a lighting part shown in FIG. 2.

FIG. 4 is an enlarged view showing a portion of a lighting part shown in FIG. 2.

Figure 5:
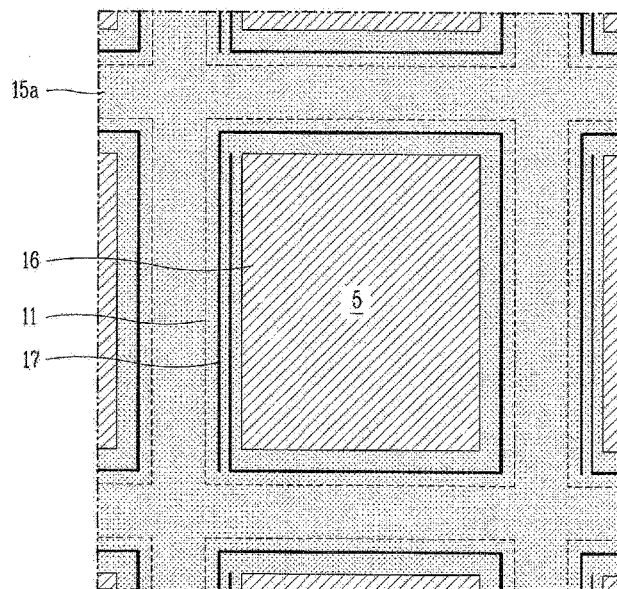
FIG. 5 is an enlarged view showing a portion of a lighting part of a comparative example.
Figure 6:
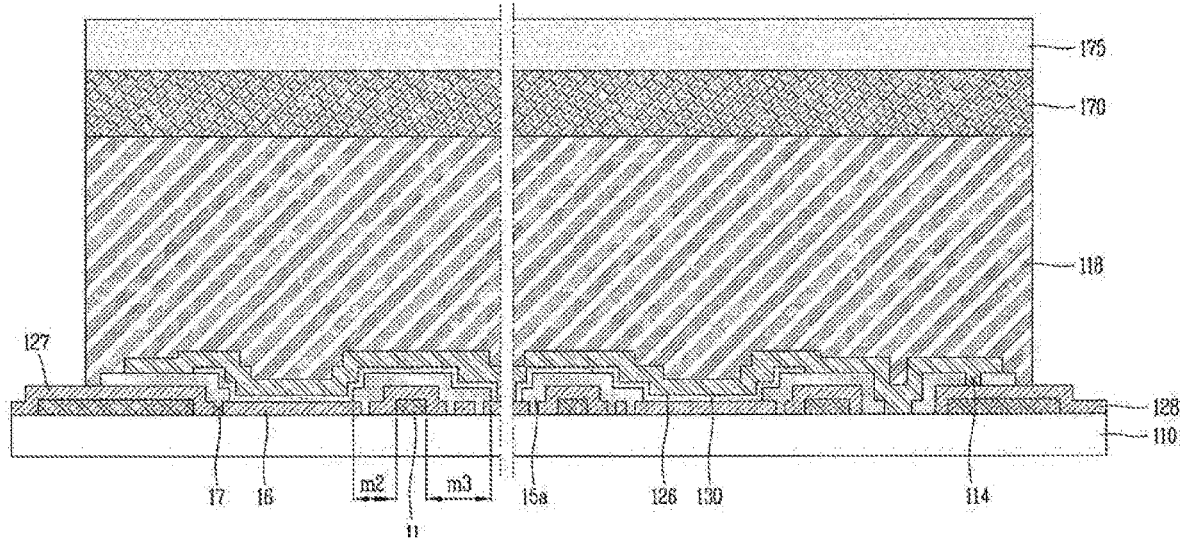
FIG. 6 is a cross-sectional view showing an example of a lighting apparatus of a comparative example.

FIG. 5 is an enlarged view showing a portion of a lighting part of a comparative example, and FIG. 6 is a cross-sectional view showing an example of a lighting apparatus of a comparative example.

The present disclosure provides a lighting apparatus using an OLED made of an organic material rather than a lighting apparatus using an inorganic light-emitting diode made of an inorganic material.

An OLED made of an organic light-emitting material has a relatively good luminous efficiency of green and red colors as compared with an inorganic light-emitting diode. In addition, since a width of an emission peak of each of red, green, and blue colors of the OLED is relatively greater than that of the inorganic light-emitting diode, a color rendering index (CRI) can be improved. Accordingly, light of a light-emitting apparatus is more close to the sunlight.

In the following description, the lighting apparatus 100 of the present disclosure will be described as being a flexible lighting apparatus having ductility. However, the present disclosure may be applied not only to the flexible lighting apparatus but also to a general nonflexible lighting apparatus.

Referring to FIGS. 1 to 4, the lighting apparatus 100 using the OLED according to the aspect of the present disclosure includes an OLED unit 101 performs surface emission and an encapsulation portion 102 encapsulating the OLED unit 101.

In this case, an outer light extraction layer 145 increasing a haze may be additionally provided on a lower portion of the OLED unit 101. However, the present disclosure is not limited thereto, and the outer light extraction layer 145 may not be provided.

The outer light extraction layer 145 may be formed by dispersing scattering particles of $TiO_2$ or the like in resin and may be attached to a lower portion of a substrate 110 through an adhesive layer (not shown).

The OLED unit 101 includes an OLED provided on the substrate 110. In this case, an inner light extraction layer 140 may be additionally provided between the substrate 110 and the OLED. However, the present disclosure is not limited thereto, and the inner light extraction layer 140 may not be provided.

A planarization layer (not shown) may be additionally provided on an upper portion of the inner light extraction layer 140.

In this case, the substrate 110 may include a lighting part EA emitting and outputting light to the outside and first and second contact parts CA1 and CA2 electrically connected to the outside through first and second contact electrodes 127 and 128 to apply a signal to the lighting part EA.

Since the first and second contact parts CA1 and CA2 are not covered with an encapsulation portion of a metal film 170 and/or a protective film 175, the first and second contact parts CA1 and CA2 may be electrically connected to the outside through the first and second contact electrodes 127 and 128. Therefore, the metal film 170 and/or the protective film 175 may be attached to the entire surface of the lighting part EA of the substrate 110 except the first and second contact parts CA1 and CA2. However, the present disclosure is not limited thereto.

In this case, the first and second contact parts CA1 and CA2 may be located outside the lighting part EA. FIG. 3 exemplarily shows that the second contact part CA2 is located between the first contact parts CA1, but the present disclosure is not limited thereto.

In addition, FIG. 3 exemplarily shows that the first and second contact parts CA1 and CA2 are located only outside one side of the lighting part EA, but the present disclosure is not limited thereto. Therefore, the first and second contact parts CA1 and CA2 of the present disclosure may be located outside both upper and lower sides of the lighting part EA.

A first electrode 116 and a second electrode 126 may be disposed on an upper portion of the substrate 110, and an organic light-emitting layer 130 may be disposed between the first electrode 116 and the second electrode 126 to form an OLED. As a current is applied to the first electrode 116 and the second electrode 126 of the OLED in the lighting apparatus 100 having such a structure, the organic light-emitting layer 130 emits and outputs light through the lighting part EA.

The organic light-emitting layer 130 may be a light-emitting layer which emits white light. In an example, the organic light-emitting layer 130 may include a blue light-emitting layer, a red light-emitting layer, and a green light-emitting layer and may have a tandem structure including a blue light-emitting layer and a yellow-green light-emitting layer. However, the organic light-emitting layer 130 of the present disclosure is not limited to the above-described structure and may have various structures.

In addition, the organic light-emitting layer 130 of the present disclosure may further include an electron injection layer injecting electrons into the light-emitting layers, a hole injection layer injecting holes into the light-emitting layers, an electron transport layer transporting the injected electrons to the light-emitting layers, a hole transport layer transporting the injected holes to the light-emitting layers, and a charge generation layer generating charges such as electrons and holes.

Here, since a first passivation layer 115a, the organic light-emitting layer 130, and the second electrode 126 are not formed in the first and second contact parts CA1 and CA2 outside the lighting part EA, the first and second contact electrodes 127 and 128 may be exposed to the outside.

Here, although not shown, a second passivation layer made of an organic material and a third passivation layer made of an inorganic material may be formed in the lighting part EA so as to cover the organic light-emitting layer 130 and the second electrode 126.

Generally, when a polymer constituting an organic light-emitting material is combined with moisture, light-emitting properties thereof can be rapidly deteriorated, resulting in reduction in luminous efficiency of the organic light-emitting layer 130. In particular, when a portion of the organic light-emitting layer 130 is exposed to the outside in the lighting apparatus 100, moisture is transmitted into the lighting apparatus 100 along the organic light-emitting layer 130, resulting in a reduction in luminous efficiency of the lighting apparatus 100. Thus, according to the present disclosure, the second passivation layer and the third passivation layer may be formed to cover the organic light-emitting layer 130 and the second electrode 126 of the lighting part EA, thereby preventing moisture from permeating the organic light-emitting layer 130 of the lighting part EA in the lighting apparatus 100, which emits and outputs actual light. Therefore, yield is improved to reduce manufacturing costs and secure reliability at the same time.

As described above, the first electrode 116 including the first contact electrode 127 and the second contact electrode 128 are disposed on the substrate 110 made of a transparent material. A hard material such as glass may be used as the substrate 110, and a material such as plastic having ductility may be used as the substrate 110 to manufacture the flexible lighting apparatus 100. In addition, in the present disclosure, since a plastic material having ductility is used as the substrate 110, a process using a roll can be performed to rapidly manufacture the lighting apparatus 100.

The first electrode 116 including the first contact electrode 127 and the second contact electrode 128 are formed in the lighting part EA and the first and second contact parts CA1 and CA2. The first electrode 116 may be divided into a first electrode 116a of a non-emission region, having relatively high resistance and a first electrode 116b of an emission region, having relatively low resistance.

The first electrode 116a of the non-emission region and the first electrode 116b of the emission region are made of a transparent conductive film having resistance higher than that of transparent conductive oxide (TCO) such as existing indium tin oxide (ITO). Thus, for convenience of description, it is assumed that the first electrode 116a and the first electrode 116b are composed of a transparent high-resistance conductive film.

The first electrode 116a of the non-emission region is formed on an auxiliary electrode 111 so as to cover the auxiliary electrode 111. The first electrode 116b of the emission region may be formed in each of emission regions (shown as 105 in FIG. 4) divided by the auxiliary electrode 111 in a net shape.

In this case, the first electrode 116a of the non-emission region of the present disclosure is composed of a transparent high-resistance conductive film having a sheet resistance of $10^8$ $\Omega$/square to $10^9$ $\Omega$/square instead of the TCO such as the existing ITO.

That is, the present disclosure is characterized in that the first electrode 116a of the non-emission region is composed of a transparent high-resistance conductive film made of a conductive polymer material, a carbon-based material, or a nanowire-based material instead of the existing ITO. Therefore, it is possible to solve the problem of lighting malfunction of an entire panel, caused by a short circuit due to a foreign substance, even without reducing an aperture ratio.

In the lighting apparatus 100 using the OLED, when a short circuit is generated between the first electrode 116 and the second electrode 126 due to a foreign substance, luminance of an entire panel as well as a corresponding pixel may be decreased due to a current drop.

In the case of a comparative example of FIGS. 5 and 6, a short reduction pattern 17 is formed on a first electrode 16 through which a current is supplied to each of pixels, thereby reflecting a narrow path. The short reduction pattern 17 is covered with a first passivation layer 15a, thereby preventing a short circuit. That is, the short reduction pattern 17 is formed so as to surround an outer peripheral portion of an emission region 5 of each pixel. Resistance is added to each pixel to limit a current flowing to a short circuit occurrence region.

In this case, the first electrode 16 of the comparative example is made of TCO such as ITO.

However, in this case, an entire aperture ratio is reduced by 8.5% due to the addition of the short reduction pattern 17 in each pixel. That is, in the case of the comparative example, minimum margins m2 and m3 of the first passivation layer 15a are respectively increased to about 14 μm and 22 μm due to the addition of the short reduction pattern 17 to the outer peripheral portion of the emission region 5.

In the present disclosure, instead of adding a short reduction pattern, the first electrode 116a of the non-emission region is composed of a transparent high-resistance conductive film having a sheet resistance of $10^8$ $\Omega$/square to $10^9$ $\Omega$/square instead of the existing ITO, and thus, resistance of the first electrode 116a itself of the non-emission region is increased to control a current imbalance due to a short circuit. In this case, the short reduction pattern can be omitted, and thus, a minimum margin m1 can be originally reduced to 5.4 μm to improve an aperture ratio.

As described above, the transparent high-resistance conductive film may be made of a conductive polymer material, a carbon-based material, a nanowire-based material, or the like.

Among these, the conductive polymer material may include a solvent, a binder, and other additives in addition to a conductive material. In this case, the conductive material may include 1% to 10% of poly(3,4-ethylenedioxythiophene) polystyrene sulfonate (PEDOT:PSS).

The solvent may include 80% to 90% of water or alcohol, and the binder may include 10% to 20% of a silicon-based binder such as tetraethyl orthosilicate (TEOS), silsesquioxane (SSQ), or polysiloxane, or an acrylic-based binder.

The additive may include about 1% of a leveling agent or a surfactant.

In addition, the carbon-based material may include graphene, a single-walled carbon nanotube (SWCNT), or a multi-walled carbon nanotube (MWCNT) as a conductive material.

The nanowire-based material may include a copper nanowire (CuNW), a silver nanowire (AgNW), or a gold nanowire (AuNW) as a conductive material.

As described above, in the transparent high-resistance conductive film of the present disclosure, which is formed by adding a conductive core made of a conductive polymer material, a carbon-based material, or a nanowire-based material in a silicon oxide base using TEOS, resistance of the transparent high-resistance conductive film can be adjusted from several $\Omega$/square to $10^9$ $\Omega$/square or more according to a content (wt %) of the conductive core.

The transparent high-resistance conductive film of the present disclosure may have a thickness of 150 nm to 200 nm when including the conductive polymer material and a thickness of 50 nm to 100 nm when including the carbon-based material, compared to the existing ITO (having a thickness of 30 nm to 50 nm).

In addition, according to the present disclosure, resistances of the first and second contact electrodes 127 and 128 and the first electrode 116b of the emission region are decreased to a level of $10^3$ $\Omega$/square to $10^4$ $\Omega$/square by post-treatment as compared with the transparent high-resistance conductive film of the first electrode 116a of the non-emission region, thereby preventing a decrease in luminance of a panel. That is, when the first electrode 116b of the emission region is formed using the transparent high-resistance conductive film of the first electrode 116a of the non-emission region, there is a possibility of a decrease in luminance due to a current drop. However, resistance can be adjusted to a level of $10^3$ $\Omega$/square to $10^4$ $\Omega$/square through a post treatment such as a heat treatment using plasma or laser, thereby securing normal luminance.

In this case, since the first electrode 116a of the non-emission region is covered with the first passivation layer 115a, the post treatment may not be performed on the first electrode 116a, and thus, the first electrode 116a may maintain an original resistance value of $10^8$ Ω/square to $10^9$ Ω/square. However, the present disclosure is not limited thereto. Instead of the post treatment, the first electrode 116a of the non-emission region and the first electrode 116b of the emission region may be composed of transparent high-resistance conductive films having different resistance values, respectively.

Figures 7, 8:
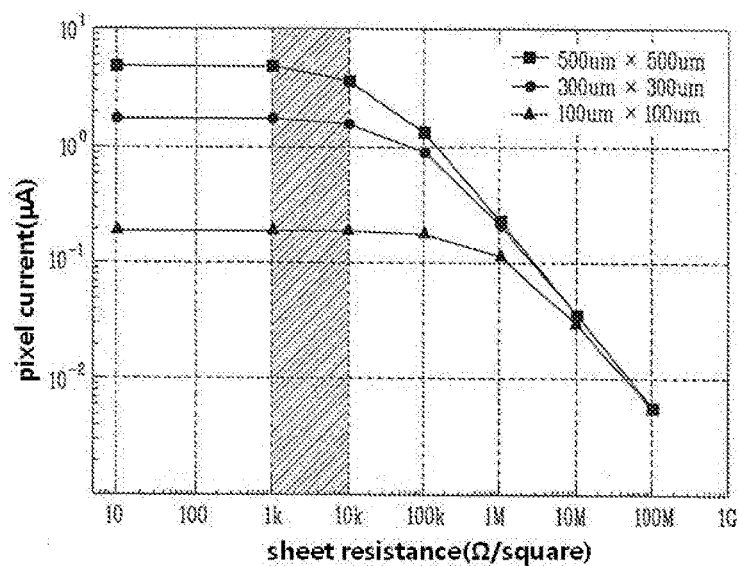
FIG. 7 is a table showing a change in resistance of a transparent high-resistance conductive film according to a heat treatment condition.
FIG. 8 is a graph showing a relationship between sheet resistance and a pixel current of a heat-treated conductive film.

FIG. 7 is a table showing a change in resistance of a transparent high-resistance conductive film according to a heat treatment condition.

Here, transparent high-resistance conductive films were formed in an ejection rate of 100 μL/s to 500 μL/s through slit coating, a heat treatment was performed on each of the transparent high-resistance conductive films five times at each of 150° C. and 250° C. at intervals of 20 minutes, and then, changes in resistance were shown in FIG. 7.

FIG. 8 is a graph showing a relationship between sheet resistance and a pixel current of a heat-treated conductive film. FIG. 8 shows a relationship between sheet resistance and a pixel current of each of conductive films heat-treated with respect to pixels having sizes of 500 μm×500 μm, 300 μm×300 μm, and 100 μm×100 μm.

Referring to FIG. 7, as a result of repeating a heat treatment on each of the transparent high-resistance conductive films, it can be confirmed that initial resistances of about $10^7$ Ω/square to about $10^8$ Ω/square are decreased to about $10^5$ Ω/square. However, when a transparent high-resistance conductive film is formed to have a specific thickness of about 718 nm or more, it can be seen that cracks are generated in the transparent high-resistance conductive film.

In particular, when a heat treatment is performed at a high temperature of 250° C. or more, it can be seen that a reduction in resistance is apparent. In an example, when a heat treatment is performed on a transparent high-resistance conductive film having a thickness of about 396 nm at a temperature of 250° C. for 20 minutes, 40 minutes, 60 minutes, 80 minutes, and 100 minutes, it can be seen that a sheet resistance is decreased from $10^{7.6}$ Ω/square to $10^{5.5}$ Ω/square, $10^{5.4}$ Ω/square, $10^{5.3}$ Ω/square, and $10^{5.3}$ Ω/square.

In addition, when a heat treatment is performed on transparent high-resistance conductive films having a thickness of 124 nm to 520 nm at a temperature of 250° C. for only 20 minutes, resistances are rapidly decreased, and as a heat treatment time is increased to 20 minutes or more, it can be seen that resistances are gradually decreased.

Referring to FIG. 8, it can be seen that proper resistance, in which a luminance decrease (current drop) does not occur and an effect as in the comparative example is implemented, is $10^3$ Ω/square or less with respect to the pixel having the size of 500 μm×500 μm.

In an example, when sheet resistance is in a range of $10^1$ Ω/square to $10^3$ Ω/square, a pixel current is constantly maintained in a range of 4.90 μA to 4.75 μA, and it can be seen that when sheet resistance is $10^4$ Ω/square, a pixel current is decreased from 4.75 μA to 3.75 μA and when sheet resistance is $10^6$ Ω/square or more, a pixel current is rapidly decreased to 0.23 μA or less.

Referring again to FIGS. 1 to 4, the first electrode 116 may be extended to the first contact part CA1 outside the lighting part EA to form the first contact electrode 127. The second contact electrode 128 electrically insulated from the first electrode 116 may be disposed in the second contact part CA2. That is, the second contact electrode 128 may be disposed in the same layer as the first electrode 116 and may be separated and electrically insulated from the first electrode 116.

In an example, FIG. 2 shows that the first electrode 116 including the first contact electrode 127 has an overall quadrangular shape, an upper central portion of the first electrode 116 is removed to form a recession, and the second contact electrode 128 is disposed in the recession, but the present disclosure is not limited thereto.

In this case, according to the present disclosure, when the first electrode 116 including the first contact electrode 127 and the second contact electrode 128 are formed as an organic film, coating may be used. Accordingly, it is possible to planarize the substrate 110 on which the auxiliary electrode 111 is formed.

The auxiliary electrode 111 may be disposed in the lighting part EA and the first contact part CA1 of the substrate 110 and may be electrically connected to the first electrode 116 and the first contact electrode 127. The first electrode 116 is composed of a transparent high-resistance conductive film and advantageously transmits emitted light, but electrical resistance thereof is disadvantageously much higher than that of an opaque metal. Therefore, when the lighting apparatus 100 having a large area is manufactured, distribution of a current applied to a wide lighting region is nonuniform due to high resistance of the transparent high-resistance conductive film, and the nonuniform distribution of the current precludes the lighting apparatus 100 having the large area from emitting light having uniform luminance.

The auxiliary electrode 111 is disposed on the entire surface of the lighting part EA in a net shape, a mesh shape, a hexagonal shape, an octagonal shape, a circular shape, or the like, which has a thin width. The auxiliary electrode 111 allows an uniform current to be applied to the whole of the lighting part EA through the first electrode 116b of the emission region 105, thereby enabling the lighting apparatus 100 having the large area to emit light having uniform luminance.

In FIG. 3, the auxiliary electrode 111 is exemplarily illustrated as being disposed on a lower portion of the first electrode 116 including the first contact electrode 127, but the present disclosure is not limited thereto. The auxiliary electrode 111 may be disposed on an upper portion of the first electrode 116 including the first contact electrode 127. Here, the auxiliary electrode 111 disposed in the first contact part CA1 may be used as a path for transferring a current to the first electrode 116 through the first contact electrode 127 and may function as a contact electrode which comes into contact with the outside to apply a current of the outside to the first electrode 116.

The auxiliary electrode 111 may be made of a metal having excellent conductivity, such as Al, Au, Cu, Ti, W, Mo, or an alloy thereof. The auxiliary electrode 111 may have a two-layered structure of an upper auxiliary electrode and a lower auxiliary electrode. However, the present disclosure is not limited thereto, and the auxiliary electrode 111 may have a single layered-structure.

The first passivation layer 115a may be stacked on the lighting part EA of the substrate 110. In FIG. 2, the first passivation layer 115a is illustrated as having a quadrangular frame shape having an overall certain width. Actually, the first passivation layer 115a may be removed from the emission region 105 and may be formed in a net shape to cover the auxiliary electrode 111 disposed in the net shape. However, the present disclosure is not limited thereto.

The first passivation layer 115a disposed in the lighting part EA may cover the auxiliary electrode 111 and the first electrode 116a of the non-emission region on an upper portion of the auxiliary electrode 111. In particular, since the first passivation layer 115a of the lighting part EA is formed to surround the auxiliary electrode 111 and reduce a stepped portion due to the auxiliary electrode 111, the first passivation layer 115a may allow various layers subsequently formed to be stably formed without being broken.

The first passivation layer 115a may be made of an inorganic material such as SiOx or SiNx. However, the first passivation layer 115a may be made of an organic material such as photoacryl and may include a plurality of layers of an inorganic material and an organic material.

The organic light-emitting layer 130 and the second electrode 126 may be disposed on the upper portion of the substrate 110, on which the first electrode 116 and the first passivation layer 115a are disposed. Here, a certain region of the first passivation layer 115a on an upper portion of the second contact electrode 128 disposed in the lighting part EA may be removed to provide a contact hole 114 exposing the second contact electrode 128. Thus, the second electrode 126 may be electrically connected to the second contact electrode 128 below the second electrode 126 through the contact hole 114.

As described above, the organic light-emitting layer 130 may be a white organic light-emitting layer. The organic light-emitting layer 130 may include the red light-emitting layer, the blue light-emitting layer, and the green light-emitting layer or may have the tandem structure including the blue light-emitting layer and the yellow-green light-emitting layer. In addition, the organic light-emitting layer 130 may include the electron injection layer injecting electrons into the light-emitting layers, the hole injection layer injecting holes into the light-emitting layers, the electron transport layer transporting the injected electrons to the light-emitting layers, the hole transport layer transporting the injected holes to the light-emitting layers, and the charge generation layer generating charges such as electrons and holes.

The second electrode 126 is desirably made of a material having a small work function such that electrons are easily injected into the organic light-emitting layer 130. A specific example of a material used as the second electrode 126 may include one selected from metals such as magnesium, calcium, sodium, titanium, indium, yttrium, lithium, gadolinium, aluminum, silver, tin, and lead, or alloys thereof.

The first electrode 116, the organic light-emitting layer 130, and the second electrode 126 of the lighting part EA constitute an OLED. In this case, when the first electrode 116 is an anode of the OLED, the second electrode 126 is a cathode thereof, and a current is applied to the first electrode 116 and the second electrode 126, electrons are injected from the second electrode 126 into the organic light-emitting layer 130, and holes are injected from the first electrode 116 into the organic light-emitting layer 130. Thereafter, excitons are generated in the organic light-emitting layer 130. As the excitons decay, light corresponding to an energy difference between a lowest unoccupied molecular orbital (LUMO) and a highest occupied molecular orbital (HOMO) is generated and emitted downwardly (toward the substrate 110 in drawings).

In this case, since the first passivation layer 115a is disposed on the upper portion of the auxiliary electrode 111 of the lighting part EA, the organic light-emitting layer 130 on the upper portion of the auxiliary electrode 111 is not in direct contact with the first electrode 116. Thus, an OLED is not formed on the upper portion of the auxiliary electrode 111. That is, in an example, an OLED in the lighting part EA is formed only in the emission region 105 within the auxiliary electrode 111 having a net shape.

Although not shown, a second passivation layer and a third passivation layer may be provided on the substrate 110 on which the second electrode 126 is formed.

As described above, the second passivation layer according to an aspect of the present disclosure may be formed to cover the organic light-emitting layer 130 and the second electrode 126 of the lighting part EA, thereby preventing moisture from permeating the organic light-emitting layer 130 of the lighting part EA.

That is, according to the present disclosure, in addition to an adhesive 118 and the encapsulation means of the metal film 170, the second passivation layer and the third passivation layer may be formed to cover the organic light-emitting layer 130 and the second electrode 126 of the lighting part EA, thereby preventing moisture from permeating the organic light-emitting layer 130 of the lighting part EA in the lighting apparatus 100, which emits and outputs actual light.

The second passivation layer may be made of an organic material such as photoacryl. In addition, the third passivation layer may be made of an inorganic material such as SiOx or SiNx. However, the present disclosure is not limited thereto.

A certain encapsulant may be provided on an upper portion of the third passivation layer. An epoxy-based compound, an acrylate-based compound, an acrylic-based compound, or the like may be used as the encapsulant.

As described above, the first contact electrode 127 extending from the first electrode 116 is exposed to the outside in the first contact part CA1 of the substrate 110. The second contact electrode 128 electrically connected to the second electrode 126 through the contact hole 114 is exposed to the outside in the second contact part CA 2 of the substrate 110. Therefore, the first contact electrode 127 and the second contact electrode 128 may be electrically connected to an external power supply to respectively apply currents to the first electrode 116 and the second electrode 126.

The third passivation layer may be coated with the adhesive 118 such as a pressure sensitive adhesive (PSA), and the metal film 170 may be disposed on the adhesive 118 and may be attached to the third passivation layer to seal the lighting apparatus 100.

In this case, the adhesive 118 and the encapsulation means of the metal film 170 may be attached to fully cover the second passivation layer and the third passivation layer.

The certain protective film 175 may be disposed on the metal film 170 so as to be attached to the entire surface of the lighting part EA of the substrate 110 except the first and second contact parts CA1 and CA2.

A photo-curable adhesive or a thermosetting adhesive may be used as the adhesive 118.

Hereinafter, a manufacturing method of a lighting apparatus using an OLED according to an aspect of the present disclosure will be described in detail with reference to the accompanying drawings.

FIGS. 9A to 9G are plan views sequentially showing a manufacturing method of the lighting apparatus using the OLED according to the aspect of the present disclosure shown in FIG. 2.

In addition, FIGS. 10A to 10G are cross-sectional views sequentially showing the manufacturing method of the lighting apparatus using the OLED according to the aspect of the present disclosure shown in FIG. 3.

Figure 9A:
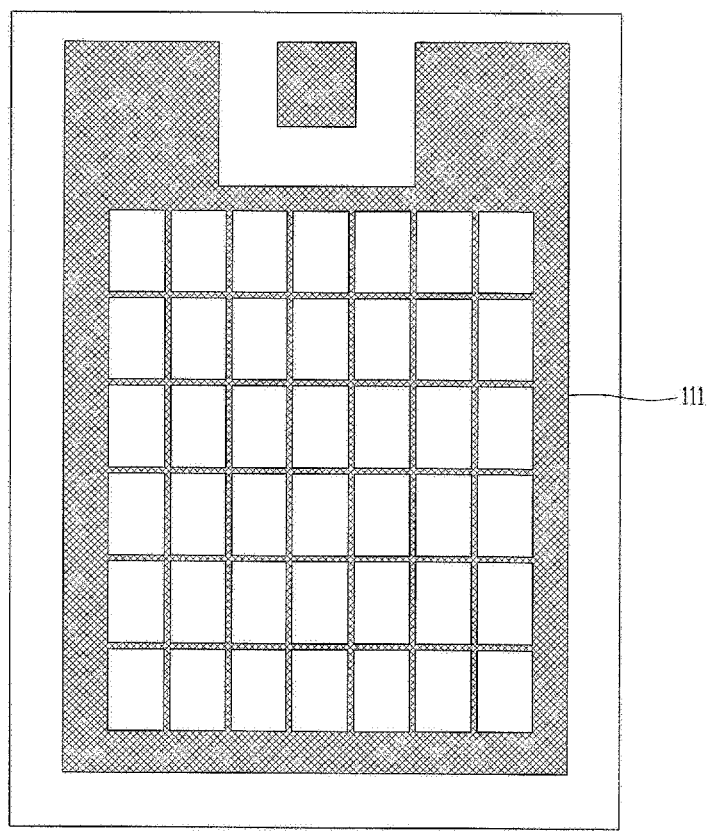
FIGS. 9A to 9G are plan views sequentially showing a manufacturing method of the lighting apparatus using the OLED according to the aspect of the present disclosure shown in FIG. 2.
Figure 10A:
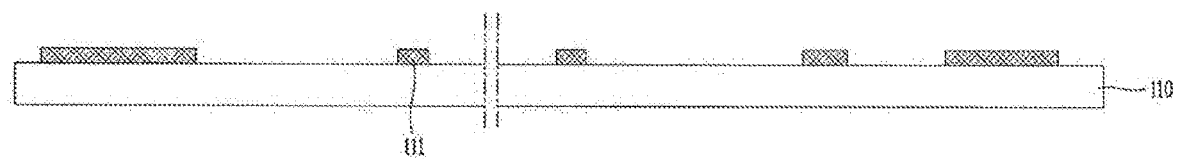
FIGS. 10A to 10G are cross-sectional views sequentially showing a manufacturing method of the lighting apparatus using the OLED according to the aspect of the present disclosure shown in FIG. 3.

First, referring to FIGS. 9A and 10A, the auxiliary electrode 111 including a single layer or a plurality of layers is formed in the lighting part EA and the first and second contact parts CA1 and CA2 by stacking and etching a metal such as Al, Au, Cu, Ti, W, Mo, or an alloy thereof on the substrate 110 divided into the lighting part EA and the first and second contact parts CA1 and CA2.

Here, although not shown, before the auxiliary electrode 111 is formed on the substrate 110, a certain buffer layer and an inner light extraction layer may be formed on an entire surface of the substrate 110.

In addition, although not shown, the auxiliary electrode 111 may have the two-layered structure of the upper auxiliary electrode and the lower auxiliary electrode.

Here, the auxiliary electrode 111 may be disposed on the entire surface of the lighting part EA in a net shape (shown in FIG. 9A), a mesh shape, a hexagonal shape, an octagonal shape, a circular shape, or the like, which has a thin width.

Figure 9B:
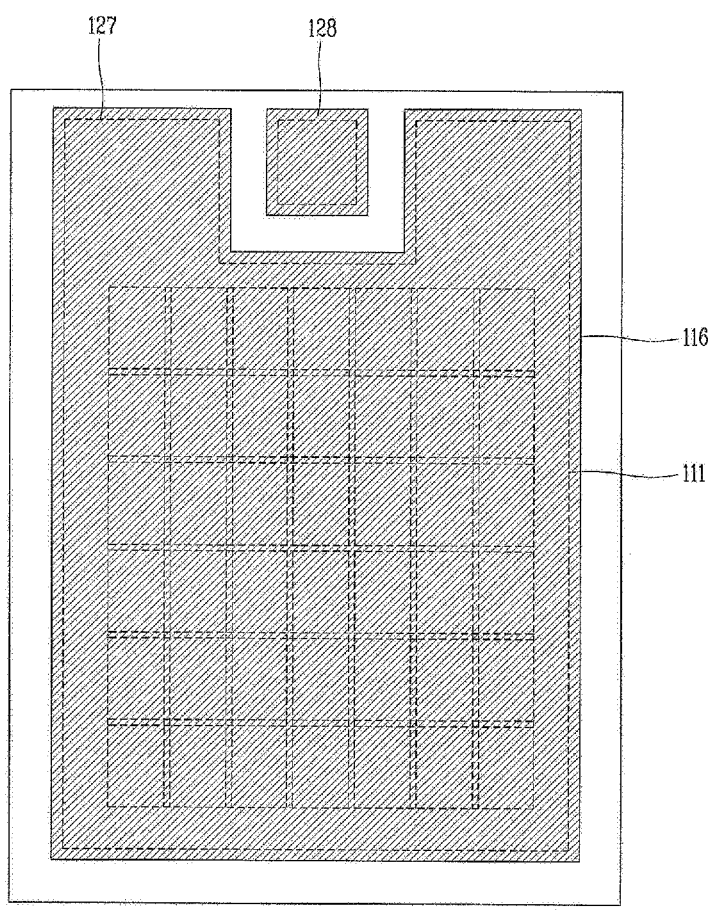
Figure 10B:
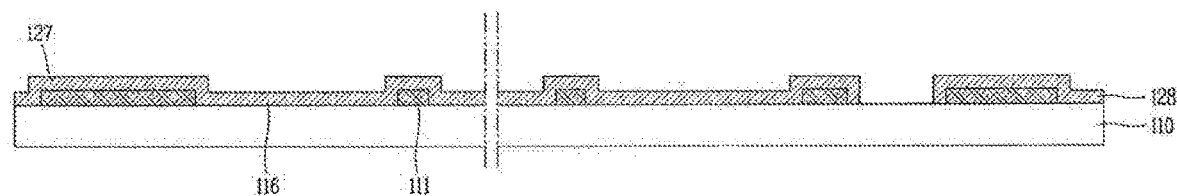

After that, referring to FIGS. 9B and 10B, a transparent high-resistance conductive film is stacked on the entire surface of the entire substrate 110.

In this case, as described above, the transparent high-resistance conductive film may be made of a conductive polymer material, a carbon-based material, a nanowire-based material, or the like.

The conductive polymer material may include a solvent, a binder, and other additives in addition to a conductive material. In this case, the conductive material may include 1% to 10% of PEDOT:PSS.

The solvent may include 80% to 90% of water or alcohol, and the binder may include 10% to 20% of a silicon-based binder such as TEOS, SSQ, or polysiloxane, or an acrylic-based binder.

The additive may include about 1% of a leveling agent or a surfactant.

In addition, the carbon-based material may include graphene, a SWCNT, or a MWCNT as a conductive material.

The nanowire-based material may include a CuNW, a AgNW, or a AuNW as a conductive material.

In this case, resistance of the transparent high-resistance conductive film of the present disclosure can be adjusted from several $\Omega$/square to $10^9$ $\Omega$/square or more according to a content (wt %) of the conductive polymer material, the carbon-based material, or the nanowire-based material. In an example, the transparent high-resistance conductive film can be adjusted to have a sheet resistance of $10^8$ $\Omega$/square to $10^9$ $\Omega$/square.

Thereafter, the first electrode 116 including the first contact electrode 127 and the second contact electrode 128 are formed in the lighting part EA and the first and second contact parts CA1 and CA 2 by selectively etching the transparent high-resistance conductive film.

In this case, the first electrode 116 may extend to the first contact part CA1 outside the lighting part EA to form the first contact electrode 127, and the second contact electrode 128 electrically insulated from the first electrode 116 may be formed at a portion of the lighting part EA and the second contact part CA2. That is, the second contact electrode 128 may be formed in the same layer as the first electrode 116 and may be separated and electrically insulated from the first electrode 116.

In an example, FIG. 9B shows that the first electrode 116 including the first contact electrode 127 is formed to have an overall quadrangular shape, an upper central portion of the first electrode 116 is removed to form a recession, and the second contact electrode 128 is formed in the recession, but the present disclosure is not limited thereto.

Here, in FIG. 10B, the auxiliary electrode 111 is illustrated as being formed on the lower portion of the first electrode 116 including the first contact electrode 127, but the present disclosure is not limited thereto. The auxiliary electrode 111 may be formed on the upper portion of the first electrode 116 including the first contact electrode 127. The auxiliary electrode 111 disposed in the first contact part CA1 may be used as a path for transferring a current to the first electrode 116 and may function as a contact electrode which comes into contact with the outside to apply a current of the outside to the first electrode 116.

Figure 9C:
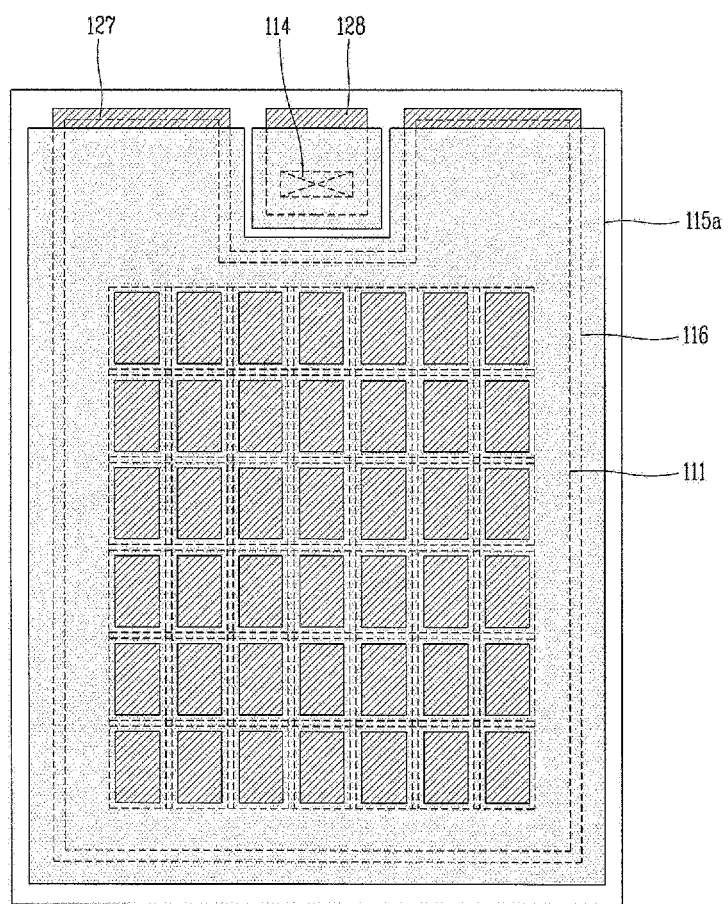
Figure 10C:
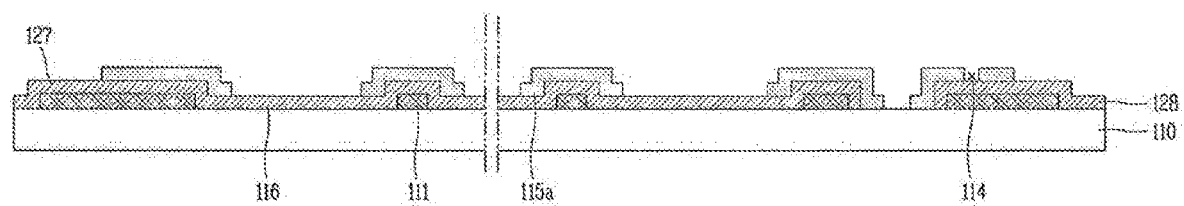

Referring to FIGS. 9C and 10C, an inorganic material such as SiNx or SiOx or an organic material such as photoacryl is stacked on the entire surface of the entire substrate 110. After that, the first passivation layer 115a is formed on an upper portion and side portions of the auxiliary electrode 111 of the lighting part EA and simultaneously the contact hole 114 exposing a portion of the second contact electrode 128 is formed by etching the inorganic material or the organic material.

In this case, the first passivation layer 115a is formed to cover the auxiliary electrode 111 and the first electrode 116 on the upper portion of the auxiliary electrode 111 but is not formed in an emission region which emits actual light (however, referring to FIG. 9C, the first passivation layer 115a may be actually formed in a net shape at a center of the lighting part EA so as to cover the auxiliary electrode 111 disposed in a net shape). In particular, since the first passivation layer 115a is formed to surround the auxiliary electrode 111 and reduces a stepped portion due to the auxiliary electrode 111, the first passivation layer 115a may allow various layers subsequently formed to be stably formed without being broken. In FIG. 9C, the first passivation layer 115a may have a quadrangular frame shape having an overall certain width. As described above, the first passivation layer 115a may be actually formed in the net shape at the center of the lighting part EA so as to cover the auxiliary electrode 111 disposed in the net shape. In addition, the first passivation layer 115a on the upper portion of the first electrode 116 and the first passivation layer 115a on the upper portion of the second contact electrode 128 are illustrated as an example in FIG. 9C as being separated (or disconnected) from each other, but the present disclosure is not limited thereto.

Figure 9D:
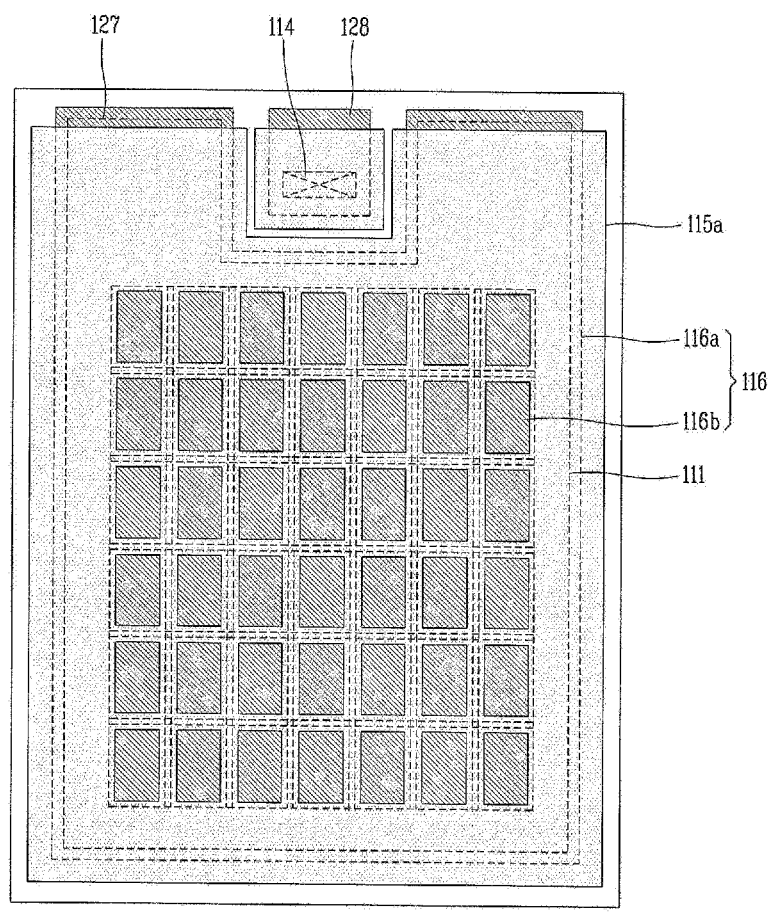
Figure 10D:
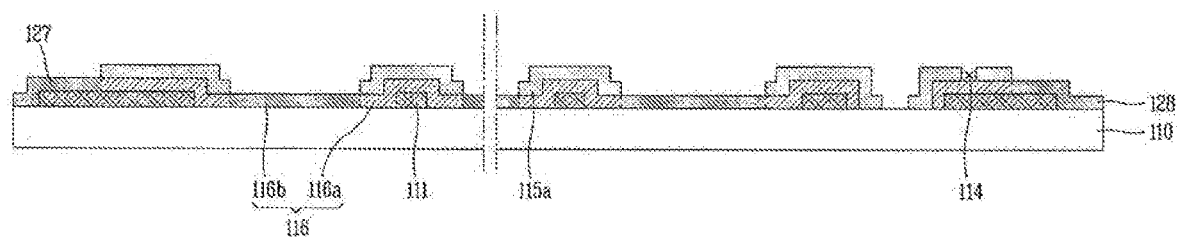

Referring to FIGS. 9D and 10D, resistances of the first and second contact electrodes 127 and 128 and the first electrode 116b are decreased to a level of $10^3$ $\Omega$/square to $10^4$ $\Omega$/square by performing a post treatment on the first and second contact electrodes 127 and 128 and the first electrode 116b of the emission region opened by removing the first passivation layer 115a.

As described above, according to the present disclosure, the resistances of the first and second contact electrodes 127 and 128 and the first electrode 116b of the emission region are decreased to a level of $10^3$ $\Omega$/square to $10^4$ $\Omega$/square through the post treatment, thereby preventing a decrease in luminance of a panel. That is, there is a possibility of a decrease in luminance due to a current drop caused by the transparent high-resistance conductive film of the emission region, but resistance can be adjusted to a level of $10^3$ $\Omega$/square to $10^4$ $\Omega$/square through a post treatment such as a heat treatment using plasma or laser, thereby securing normal luminance.

In this case, as described above, since the first electrode 116a of the non-emission region except the emission region is covered with the first passivation layer 115a, a post treatment may not be performed on the first electrode 116a, and thus, the first electrode 116a maintains an original resistance value of $10^8$ $\Omega$/square to $10^9$ $\Omega$/square.

Referring to FIGS. 9E and 9F and FIGS. 10E and 10F, the organic light-emitting layer 130 made of an organic light-emitting material and the second electrode 126 made of a metal are respectively formed in the lighting part EA of the substrate 110.

Figure 9E:
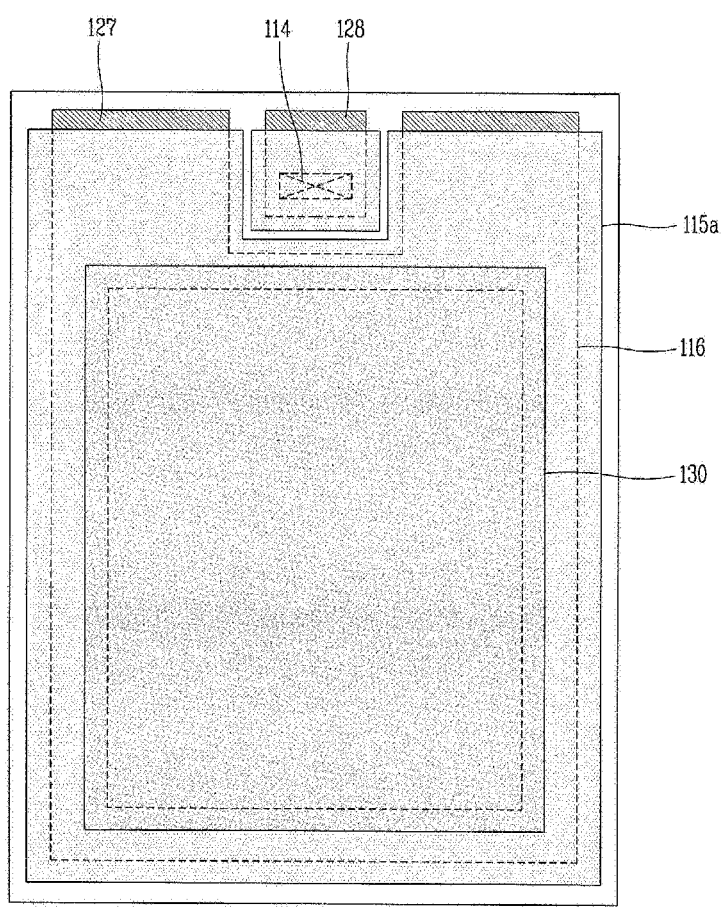
Figure 10E:
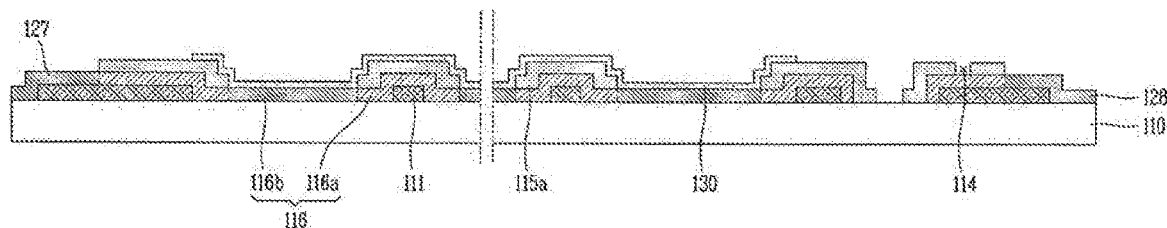

First, referring to FIGS. 9E and 10E, the organic light-emitting layer 130 made of an organic light-emitting material is formed in the lighting part EA of the substrate 110.

In this case, the organic light-emitting layer 130 may be the white organic light-emitting layer. The organic light-emitting layer 130 may include the red light-emitting layer, the blue light-emitting layer, and the green light-emitting layer or may have the tandem structure including the blue light-emitting layer and the yellow-green light-emitting layer. In addition, the organic light-emitting layer 130 may include the electron injection layer injecting electrons into the light-emitting layers, the hole injection layer injecting holes into the light-emitting layers, the electron transport layer transporting the injected electrons to the light-emitting layers, the hole transport layer transporting the injected holes to the light-emitting layers, and the charge generation layer generating charges such as electrons and holes.

Figure 9F:
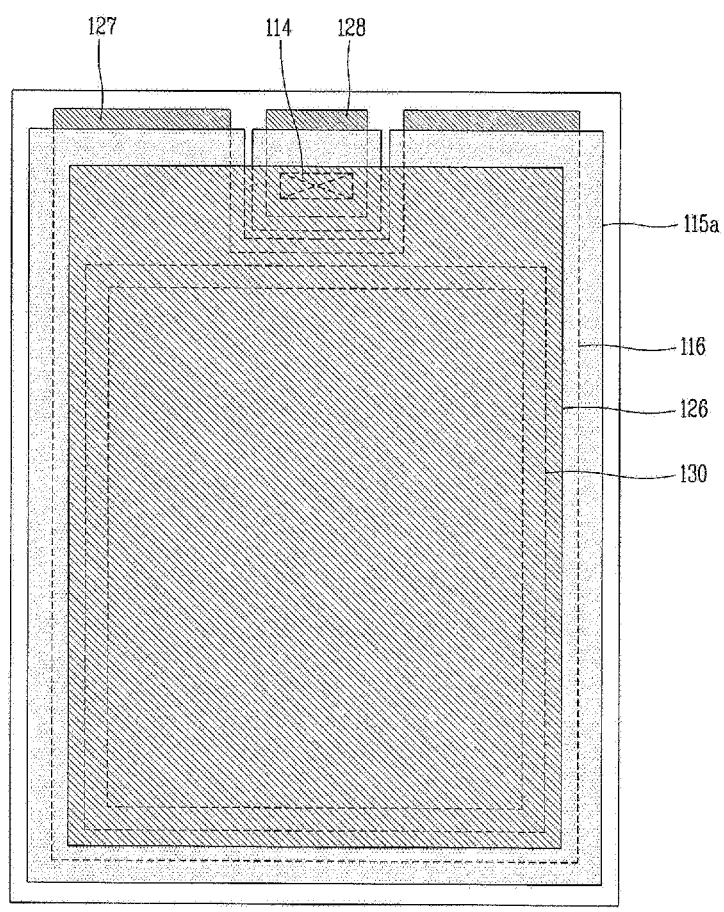
Figure 10F:
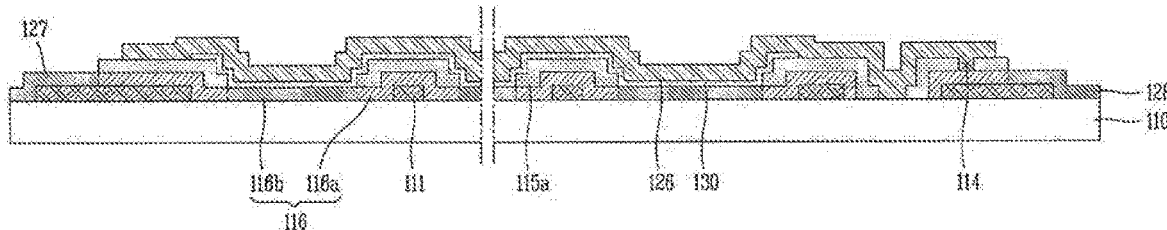

Next, referring to FIGS. 9F and 10F, the second electrode 126 made of a metal is formed in the lighting part EA of the substrate 110 so as to cover the organic light-emitting layer 130.

In this case, the second electrode 126 may be electrically connected to the second contact electrode 128 below the second electrode 126 through the contact hole 114.

The second electrode 126 may be made of one selected from metals such as magnesium, calcium, sodium, titanium, indium, yttrium, lithium, gadolinium, aluminum, silver, tin, and lead, or alloys thereof.

The first electrode 116, the organic light-emitting layer 130, and the second electrode 126 of the lighting part EA constitute an OLED.

In this case, since the first passivation layer 115a is disposed on the upper portion of the auxiliary electrode 111 of the lighting part EA, the organic light-emitting layer 130 on the upper portion of the auxiliary electrode 111 is not in direct contact with the first electrode 116. Thus, an OLED is not formed on the upper portion of the auxiliary electrode 111. That is, in an example, an OLED in the lighting part EA is formed only in each of emission regions divided by the auxiliary electrode 111 having a net shape (shown in FIG. 4).

Next, although not shown, the second passivation layer made of an organic material may be formed in the lighting part EA of the substrate 110 so as to cover the organic light-emitting layer 130 and the second electrode 126.

In this case, as described above, the second passivation layer may be formed to cover the organic light-emitting layer 130 and the second electrode 126 of the lighting part EA, thereby preventing moisture from permeating the organic light-emitting layer 130 of the lighting part EA.

The organic light-emitting layer 130, the second electrode 126, and the second passivation layer may be formed in-line through a roll-manufacturing apparatus, but the present disclosure is not limited thereto.

Next, the three passivation layer may be formed in the lighting part EA of the substrate 110 so as to cover the second passivation layer.

The third passivation layer may be formed through another roll-manufacturing apparatus.

The third passivation layer may be made of an inorganic material such as SiOx or SiNx. However, the present disclosure is not limited thereto.

The certain encapsulant may be additionally provided on the upper portion of the third passivation layer. An epoxy-based compound, an acrylate-based compound, an acrylic-based compound, or the like may be used as the encapsulant.

Figure 9G:
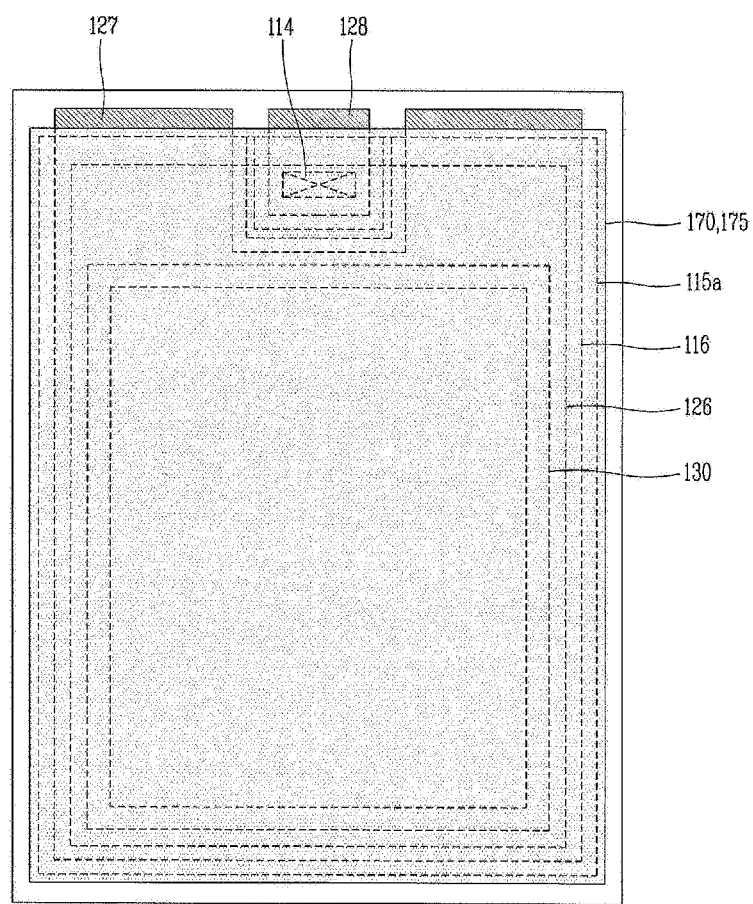
Figure 10G:
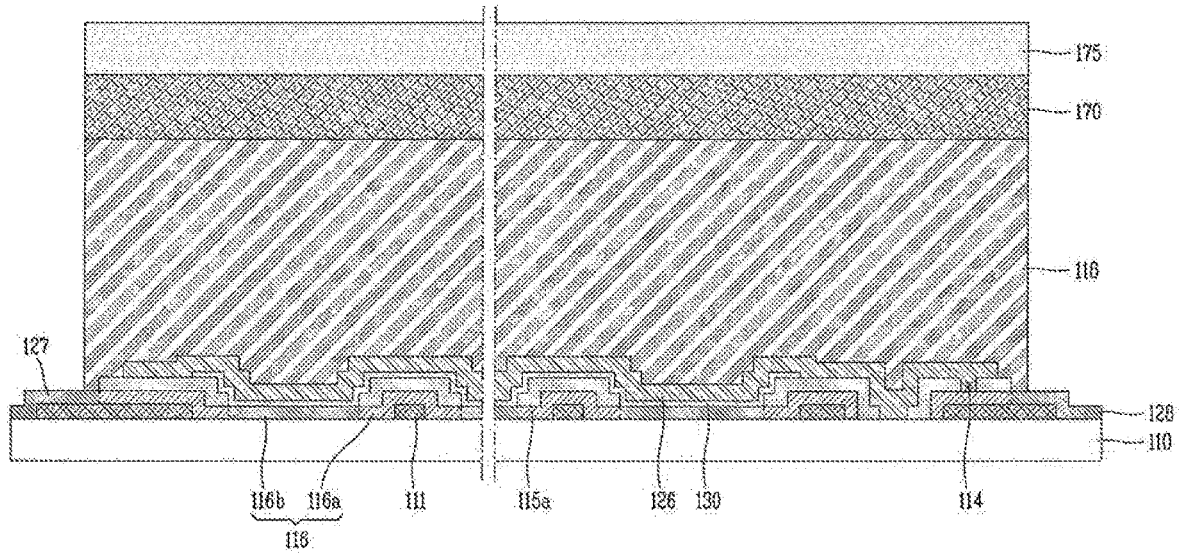

Next, referring to FIGS. 9G and 10G, the adhesive 118 made of a photo-curable adhesive material or a thermosetting adhesive material is applied on the lighting part EA of the substrate 110. The metal film 170 is placed on the adhesive 118 and then is attached by curing the adhesive 118.

In this case, since the first and second contact parts CA1 and CA2 are not covered with the encapsulation means of the metal film 170, the first and second contact parts CA1 and CA2 may be electrically connected to the outside through the first and second contact electrodes 127 and 128.

The lighting apparatus may be completed by attaching the certain protective film 175 to the entire surface of the lighting part EA of the substrate 110 except the first and second contact parts CA1 and CA2.

As described above, according to the present disclosure, a first electrode is composed of a transparent high-resistance conductive film instead of ITO, thereby controlling a current imbalance due to a short circuit, and resistance of a first electrode of an emission region is decreased through a post treatment, thereby preventing a decrease in luminance. However, the present disclosure is not limited thereto. Instead of a post treatment, a first electrode of an emission region may be made of a transparent high-resistance conductive film having a resistance value lower than that of a first electrode of a non-emission region. This will be described in detail with reference to the drawings.

FIGS. 11A to 11G are cross-sectional views sequentially showing another manufacturing method of a lighting apparatus using an OLED according to an aspect of the present disclosure.

Figure 11A:
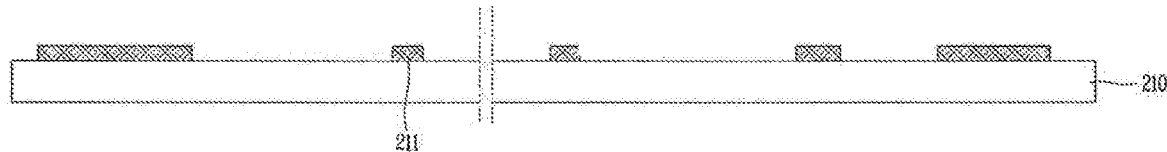
FIGS. 11A to 11G are cross-sectional views sequentially showing another manufacturing method of a lighting apparatus using an OLED according to an aspect of the present disclosure.

Referring to FIG. 11A, an auxiliary electrode 211 including a single layer or a plurality of layers is formed in a lighting part and first and second contact parts by stacking and etching a metal such as Al, Au, Cu, Ti, W, Mo, or an alloy thereof on a substrate 210 divided into the lighting part and the first and second contact parts.

Here, although not shown, before the auxiliary electrode 211 is formed on the substrate 210, a certain buffer layer and an inner light extraction layer may be formed on an entire surface of the substrate 210.

In addition, although not shown, the auxiliary electrode 211 may have a two-layered structure of an upper auxiliary electrode and a lower auxiliary electrode.

In this case, as described above, the auxiliary electrode 211 may be disposed on an entire surface of the lighting part EA in a net shape, a mesh shape, a hexagonal shape, an octagonal shape, a circular shape, or the like, which has a thin width.

Figure 11B:
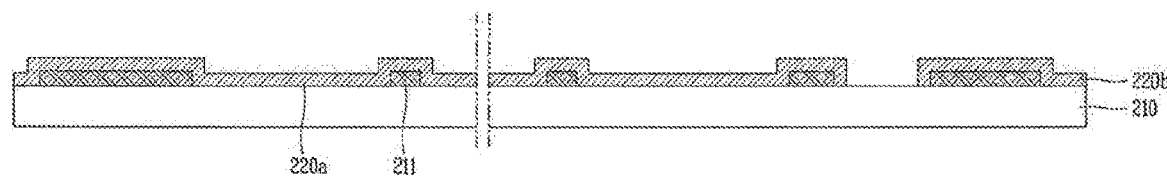

After that, referring to FIG. 11B, a transparent high-resistance conductive film is stacked on the entire surface of the entire substrate 210.

In this case, as described above, the transparent high-resistance conductive film may be made of a conductive polymer material, a carbon-based material, a nanowire-based material, or the like.

The conductive polymer material may include a solvent, a binder, and other additives in addition to a conductive material. In this case, the conductive material may include 1% to 10% of PEDOT:PSS.

The solvent may include 80% to 90% of water or alcohol, and the binder may include 10% to 20% of a silicon-based binder such as TEOS, SSQ, or polysiloxane, or an acrylic-based binder.

The additive may include about 1% of a leveling agent or a surfactant.

In addition, the carbon-based material may include graphene, a SWCNT, or a MWCNT as a conductive material.

The nanowire-based material may include a CuNW, a AgNW, or a AuNW as a conductive material.

In this case, resistance of the transparent high-resistance conductive film of the present disclosure can be adjusted from several $\Omega$/square to $10^9$ $\Omega$/square or more according to a content (wt %) of the conductive polymer material, the carbon-based material, or the nanowire-based material. In an example, the transparent high-resistance conductive film can be adjusted to have a sheet resistance of $10^8$ $\Omega$/square to $10^9$ $\Omega$/square.

Thereafter, conductive patterns 220a and 220b are formed in the lighting part and the first and second contact parts by selectively etching the transparent high-resistance conductive film.

In this case, in the conductive patterns 220a and 220b, a first conductive pattern 220a may be extended to the first contact part outside the lighting part, and a second conductive pattern 220b electrically insulated from the first conductive pattern 220a may be formed at a portion of the lighting part and the second contact part. That is, the second conductive pattern 220b may be formed in the same layer as the first conductive pattern 220a and may be separated and electrically insulated from the first conductive pattern 220a.

In an example, the first conductive pattern 220a may be formed to have an overall quadrangular shape, an upper central portion of the first conductive pattern 220a may be removed to form a recession, and the second conductive pattern 220b may be formed in the recession, but the present disclosure is not limited thereto In this case, in FIG. 11B, the auxiliary electrode 211 is illustrated as being formed on lower portions of the conductive patterns 220a and 220b, but the present disclosure is not limited thereto. The auxiliary electrode 211 may be formed on upper portions of the conductive patterns 220a and 220b.

Figure 11C:
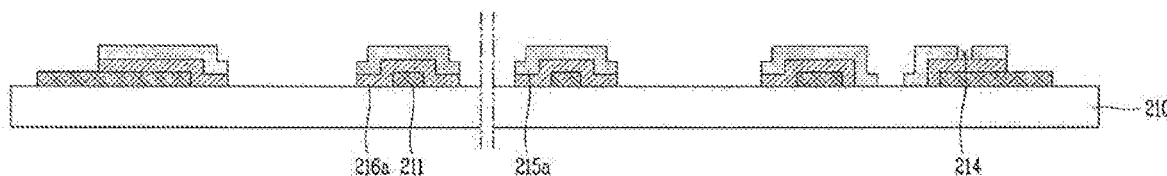

Next, referring to FIG. 11C, an inorganic material such as SiNx or SiOx or an organic material such as photoacryl is stacked on the entire substrate 210. A first passivation layer 215a is formed on an upper portion and side portions of the auxiliary electrode 211 of the lighting part and simultaneously a contact hole 214 exposing a portion of the second conductive pattern 220b of the second contact part is formed by etching the inorganic material or the organic material. At this time, the first passivation layer 215a may be formed in the first and second contact parts such that outer portions of the conductive patterns 220a and 220b are partially exposed.

Then, a first electrode 216a of a non-emission region, having a sheet resistance of $10^8$ $\Omega$/square to $10^9$ $\Omega$/square, is formed in the lighting part by selectively removing a conductive pattern on a lower portion of the first passivation layer 215a by using the first passivation layer 215a as a mask.

In this case, the first passivation layer 215a is formed to cover the auxiliary electrode 211 and the first electrode 216a of the non-emission region on the upper portion of the auxiliary electrode 211 and thus is not formed in an emission region which emits actual light (however, as described above, the first passivation layer 215a may be actually formed in a net shape at a center of the lighting part so as to cover the auxiliary electrode 211 disposed in a net shape). In particular, since the first passivation layer 215a is formed to surround the auxiliary electrode 211 and reduce a stepped portion due to the auxiliary electrode 211, the first passivation layer 215a may allow various layers subsequently formed to be stably formed without being broken. The first passivation layer 215a may be formed to have a quadrangular frame shape having an overall certain width. As described above, the first passivation layer 215a may be actually formed in the net shape at the center of the lighting part so as to cover the auxiliary electrode 211 disposed in the net shape. In addition, the first passivation layer 215a of the lighting part and the first contact part and the first passivation layer 215a of the second contact part are illustrated as an example as being separated (disconnected) from each other, but the present disclosure is not limited thereto.

Figure 11D:
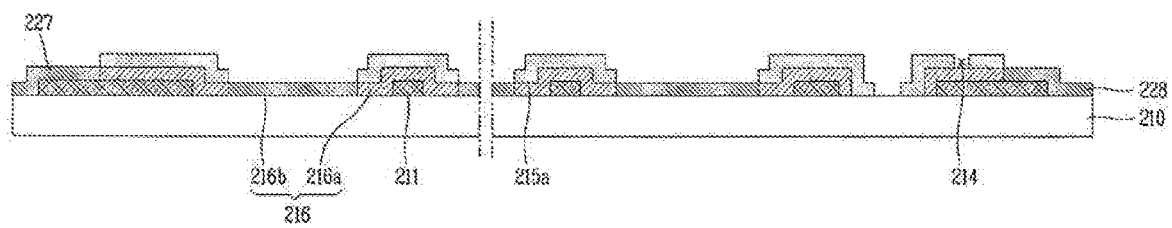

After that, referring to FIG. 11D, first and second contact electrodes 227 and 228 are formed in the first and second contact parts and a first electrode 216b of an emission region is formed in the emission region of the lighting part, the first and second contact parts and the emission region of the lighting part being opened by removing the first passivation layer 215a.

In this case, the first and second contact electrodes 227 and 228 and the first electrode 216b of the emission region are made of the above-described transparent high-resistance conductive film. A transparent high-resistance conductive film having a resistance of $10^3$ $\Omega$/square to $10^4$ $\Omega$/square is formed by adjusting a content (wt %) of a conductive polymer material, a carbon-based material, or a nanowire-based material.

As described above, according to the present disclosure, the first and second contact electrodes 227 and 228 and the first electrode 216b of the emission region have a decreased resistance of $10^3$ $\Omega$/square to $10^4$ $\Omega$/square as compared with the first electrode 216a of the non-emission region, thereby preventing a decrease in luminance of a panel.

In this case, the first electrode 216b of the emission region and the first electrode 216a of the non-emission region may constitute a first electrode 216. The first electrode 216 may extend to the first contact part outside the lighting part to form the first contact electrode 227, and the second contact electrode 228 electrically insulated from the first electrode 216 may be formed at a portion of the lighting part and the second contact part. That is, the second contact electrode 228 may be formed in the same layer as the first electrode 216 and may be separated and electrically insulated from the first electrode 216.

Figure 11E:
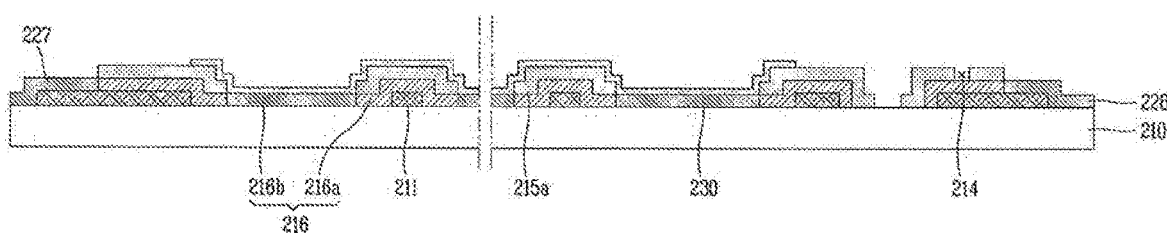
Figure 11F:
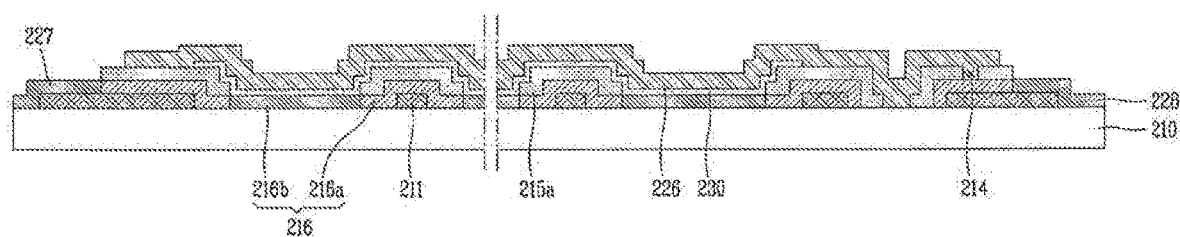

Referring to FIGS. 11E and 11F, an organic light-emitting layer 230 made of an organic light-emitting material and a second electrode 226 made of a metal are formed in the lighting part of the substrate 210.

First, referring to FIG. 11E, the organic light-emitting layer 230 made of the organic light-emitting material is formed in the lighting part of the substrate 210.

In this case, the organic light-emitting layer 230 may be a white organic light-emitting layer. The organic light-emitting layer 230 may include a red light-emitting layer, a blue light-emitting layer, and a green light-emitting layer or may have a tandem structure including a blue light-emitting layer and a yellow-green light-emitting layer. In addition, the organic light-emitting layer 230 may include an electron injection layer injecting electrons into the light-emitting layers, a hole injection layer injecting holes into the light-emitting layers, an electron transport layer transporting the injected electrons to the light-emitting layers, a hole transport layer transporting the injected holes to the light-emitting layers, and a charge generation layer generating charges such as electrons and holes.

Next, referring to FIG. 11F, the second electrode 226 made of the metal is formed in the lighting part of the substrate 210 so as to cover the organic light-emitting layer 230.

In this case, the second electrode 226 may be electrically connected to the second contact electrode 228 below the second electrode 226 through the contact hole 214.

The second electrode 226 may be made of a metal such as Al, Mo, Cu, Ag, or an alloy such as MoTi.

The first electrode 216, the organic light-emitting layer 230, and the second electrode 226 of the lighting part constitute an OLED.

Next, although not shown, a second passivation layer made of an organic material may be formed in the lighting part of the substrate 210 so as to cover the organic light-emitting layer 230 and the second electrode 226.

Then, a third passivation layer may be formed in the lighting part of the substrate 210 so as to cover the second passivation layer.

The third passivation layer may be made of an inorganic material such as SiOx or SiNx. However, the present disclosure is not limited thereto.

A certain encapsulant may be additionally on an upper portion of the third passivation layer. An epoxy-based compound, an acrylate-based compound, an acrylic-based compound, or the like may be used as the encapsulant.

Figure 11G:
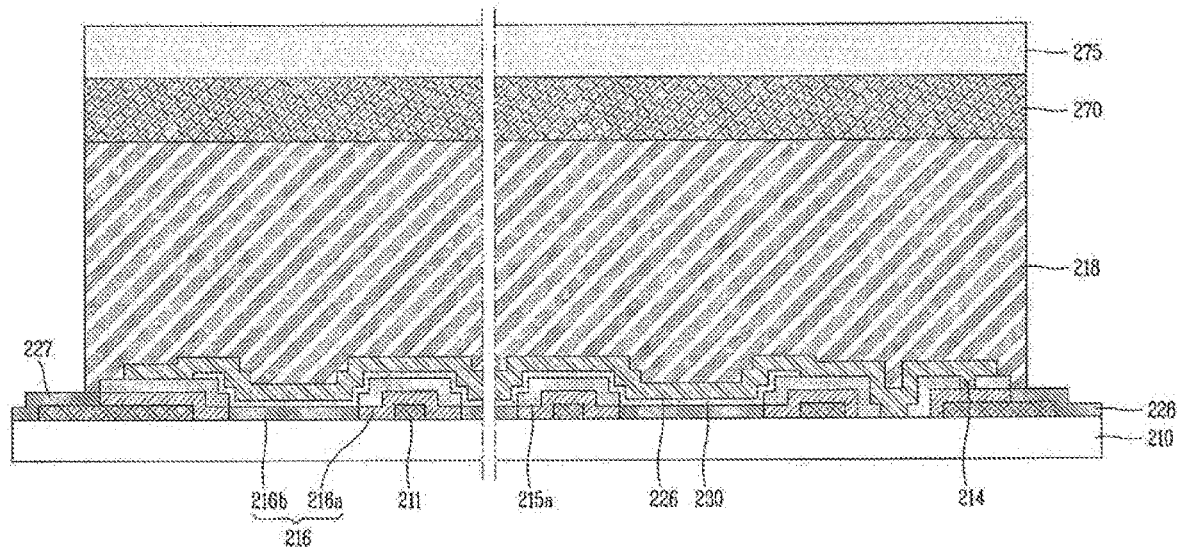

Next, referring to FIG. 11G, an adhesive 218 made of a photo-curable adhesive material or a thermosetting adhesive material is applied on the lighting part of the substrate 210. A metal film 270 is placed on the adhesive 218 and then is attached by curing the adhesive 218.

In this case, since the first and second contact parts are not covered with an encapsulation means of the metal film 270, the first and second contact parts may be electrically connected to the outside through the first and second contact electrodes 227 and 228.

After that, the lighting apparatus may be completed by attaching a certain protective film 275 to the entire surface of the lighting part of the substrate 210 except the first and second contact parts.

As described above, according to a lighting apparatus using an OLED and a manufacturing method thereof according to an aspect of the present disclosure, it is possible to solve the problem of lighting malfunction of an entire panel, caused by a short circuit due to a foreign substance, even without reducing an aperture ratio, and concurrently, it is possible to secure normal luminance as resistance of an emission region is decreased.

Although many subject matters have been specifically disclosed in the foregoing description, they should be construed as illustration of exemplary aspects rather than limitation of the scope of the present disclosure. Consequently, the present disclosure should not be determined by the aspects disclosed herein but should be determined by the claims and the equivalents thereof.

What is claimed is:

1. A lighting apparatus using an organic light-emitting diode, the lighting apparatus comprising:
    an auxiliary electrode disposed on a substrate;
    a first electrode of a non-emission region formed of a transparent conductive film and covering the auxiliary electrode, and a first electrode of an emission region disposed on each of side surfaces of the first electrode of the non-emission region;
    a first passivation layer disposed on an upper portion of the first electrode of the non-emission region;
    an organic light-emitting layer and a second electrode, disposed in a lighting part of the substrate on which the first passivation layer is disposed; and
    a metal film disposed in the lighting part of the substrate,
    wherein the first electrode of the non-emission region has a resistance value higher than that of indium tin oxide (ITO), and the first electrode of the emission region has a resistance value lower than that of the first electrode of the non-emission region.

2. The lighting apparatus of claim 1, wherein the first electrode of the non-emission region has a sheet resistance in a range of $10^8$ Ω/square to $10^9$ Ω/square.

3. The lighting apparatus of claim 1, wherein the first electrode of the emission region has a sheet resistance in a range of $10^3$ Ω/square to $10^4$ Ω/square.

4. The lighting apparatus of claim 1, wherein the transparent conductive film includes 1% to 10% of a conductive material, 80% to 90% of a solvent, 10% to 20% of a binder, and about 1% of an additive.

5. The lighting apparatus of claim 4, wherein the conductive material includes a conductive polymer material.

6. The lighting apparatus of claim 5, wherein the conductive polymer material includes poly(3,4-ethylenedioxythiophene) polystyrene sulfonate (PEDOT:PSS).

7. The lighting apparatus of claim 4, wherein the binder includes a silicon-based binder or an acrylic-based binder.

8. The lighting apparatus of claim 7, wherein the silicon-based binder includes tetraethyl orthosilicate (TEOS), silsesquioxane (SSQ), or polysiloxane.

9. The lighting apparatus of claim 4, wherein the conductive material includes graphene, a single-walled carbon nanotube (SWCNT), or a multi-walled carbon nanotube (MWCNT).

10. The lighting apparatus of claim 4, wherein the conductive material includes a copper nanowire (CuNW), a silver nanowire (AgNW), or a gold nanowire (AuNW).

11. The lighting apparatus of claim 1, wherein the first electrode of the non-emission layer has a side surface matching a side surface of the first passivation layer on the upper portion thereof.

12. The lighting apparatus of claim 1, wherein the auxiliary electrode allows uniform current to be applied to an entire area of the lighting part through the first electrode of the emission region.

* * * * *